United States Patent

Sauber et al.

Patent Number: 6,028,347
Date of Patent: Feb. 22, 2000

[54] SEMICONDUCTOR STRUCTURES AND PACKAGING METHODS

[75] Inventors: John B. Sauber, Millbury; John A. Kowaleski, Jr., Princeton; Jeffrey G. Maggard, Hudson, all of Mass.

[73] Assignee: Digital Equipment Corporation, Maynard, Mass.

[21] Appl. No.: 08/763,046

[22] Filed: Dec. 10, 1996

[51] Int. Cl.⁷ .................................................. H01L 29/06
[52] U.S. Cl. ....................... 257/622; 257/623; 257/626; 257/618; 257/619; 257/620; 257/632
[58] Field of Search .................................. 257/622, 623, 257/618, 620, 619, 632, 633, 634, 635

[56] References Cited

U.S. PATENT DOCUMENTS

| 5,763,936 | 6/1998 | Yamaha et al. | 257/644 |
| 5,831,330 | 11/1998 | Chang | 257/620 |

*Primary Examiner*—Tom Thomas
*Assistant Examiner*—Luan Thai
*Attorney, Agent, or Firm*—Sharp, Comfort & Merrett, P.C.

[57] ABSTRACT

A semiconductor structure having: semiconductor devices formed in an inner region of a semiconductor chip; a seal ring formed in the chip and disposed about the inner region; and, a plurality of trenches formed along a surface of the chip. The trenches are disposed in a corner region of the chip. A portion of the seal ring is disposed between the trenches and the inner region of the chip. The trenches are disposed along axes oblique to outer edges of the chip. A method is provided for encapsulating a semiconductor chip. The method includes the steps of: providing a semiconductor chip having active semiconductor devices in an inner region of the semiconductor chip and a seal ring in the chip about the inner region; and, forming a plurality of trenches in the chip, a portion of the seal ring being formed between the trenches and the inner region of the chip. A cover is formed having bottom portions in the trenches and on the passivation layer. In particular, the cover is formed by flowing plastic material over the passivation layer and into the trenches to fill such trenches with such plastic material.

9 Claims, 4 Drawing Sheets

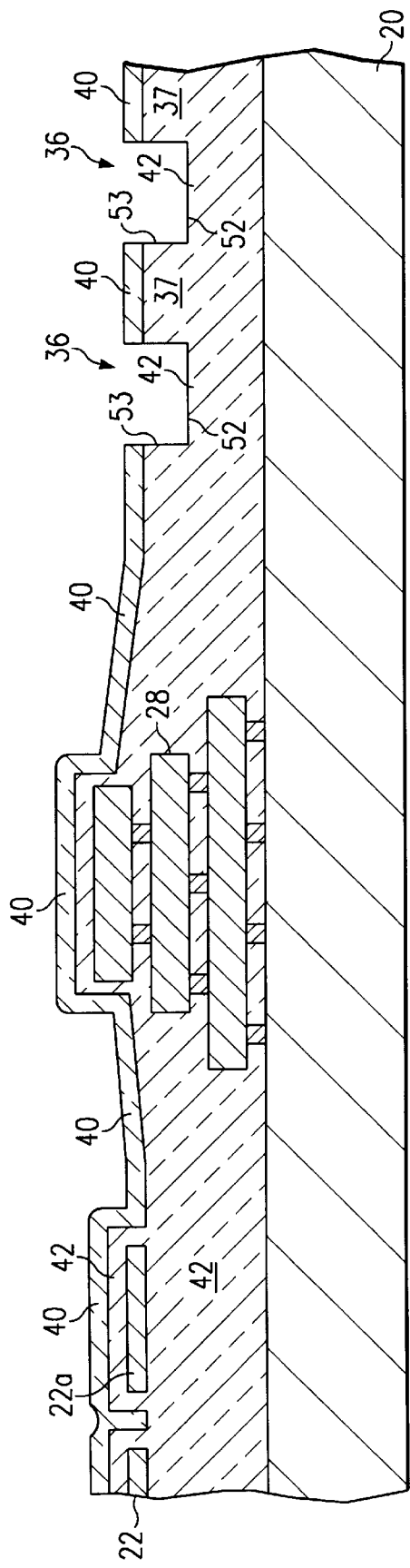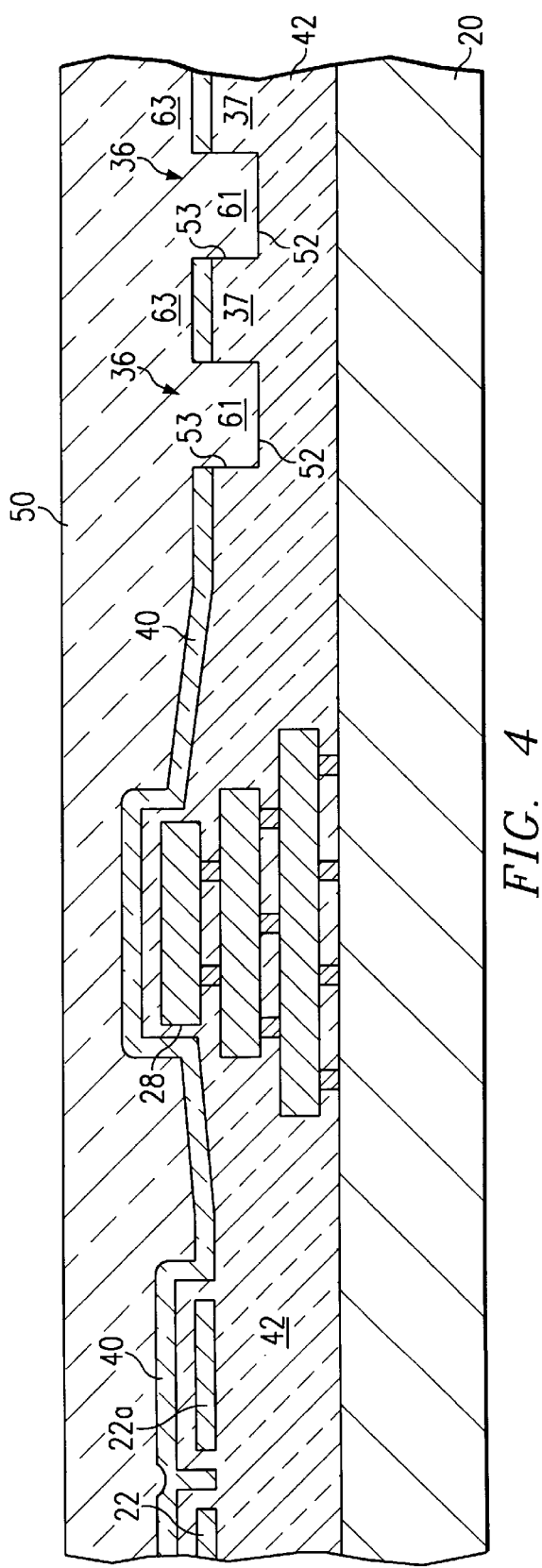

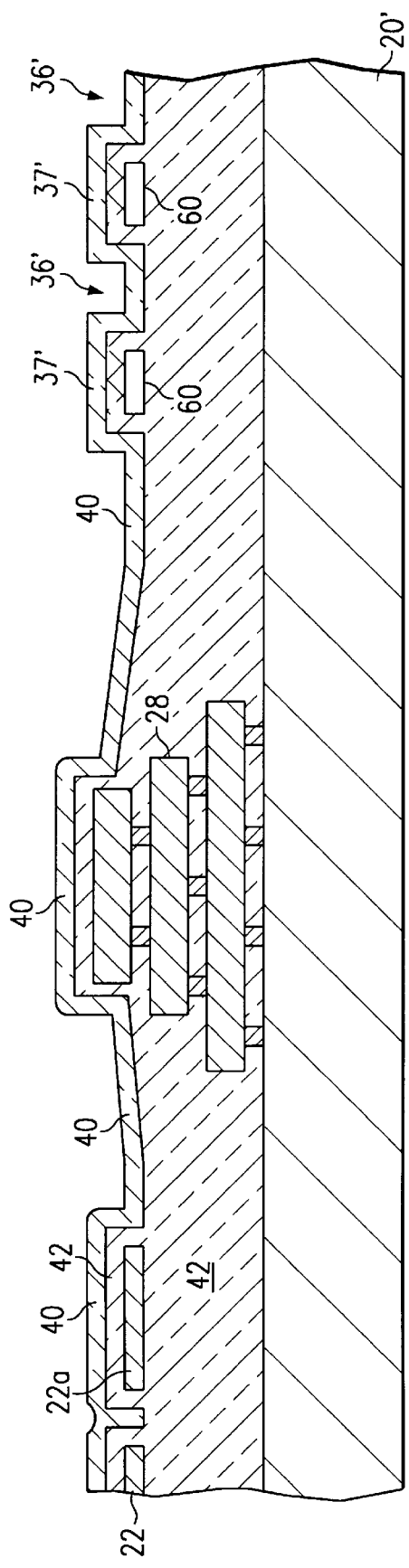
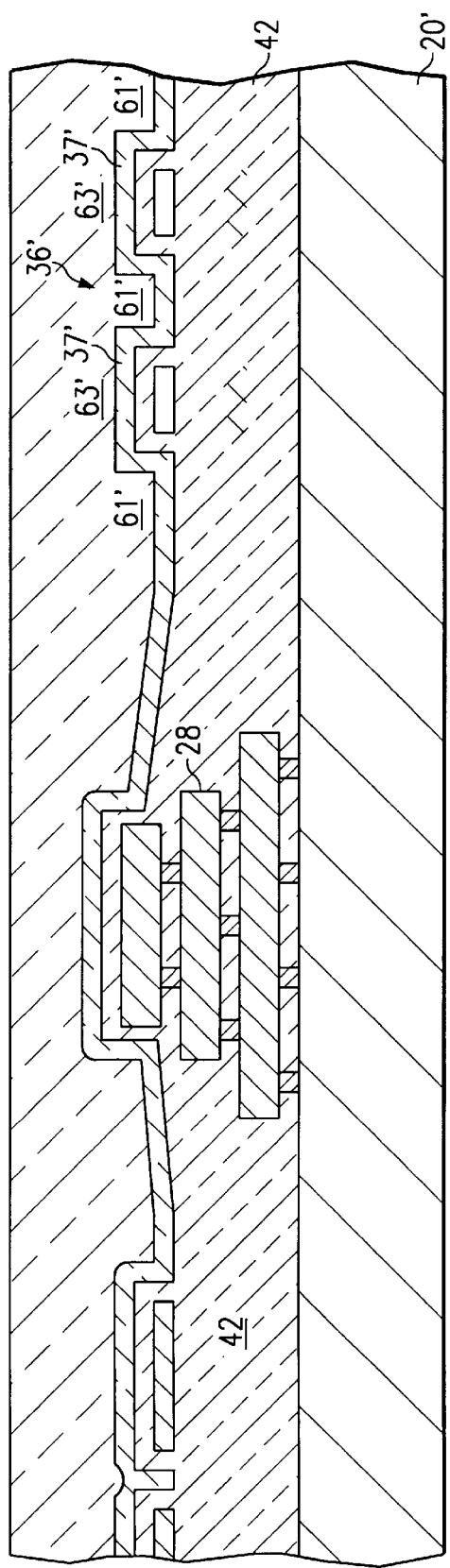

SEMICONDUCTOR STRUCTURES AND PACKAGING METHODS

BACKGROUND OF THE INVENTION

This invention relates generally to semiconductor structures and methods for packaging such structures.

As is known in the art, after active semiconductor devices have been formed in a semiconductor chip, in order to protect such devices the chip is encapsulated in packaging material. Also, a seal ring is typically formed in the dielectric layer around the outer edge region of the chip to protect the active devices formed in the inner region of the chip from contaminants.

In a typical fabrication process, a large single crystal of silicon is sliced into wafers which are typically 6 inches to 12 inches in diameter, but only 0.011 inches to 0.024 inches thick. Using vapor deposition and photo-imageable masking technology, alternating layers of aluminum and glass-like PETOS dielectric (Plasma Enhanced TetraEthylOrthoSilicate, commonly called "oxide") are applied to the surface of the wafer. Since these layers are deposited at high temperatures and since the aluminum typically used for electrical interconnect lines and the oxide have very different thermal coefficients (23 ppm/° C. and 0.5 ppm/° C., respectively), a great deal of intrinsic stress is generated when the wafer is cooled to room temperature. After depositing a final passivation layer, typically of silicon nitride, to protect the active circuits previously formed in the wafer, the wafer is sawed apart to singulate the individual dies, or chips. The dies are tested electrically and then installed into a package. The package is typically made of either ceramic (for high power/high cost devices) or plastic (for low power/low cost devices). For plastic packaging, the die is mounted on a die pad portion of a copper lead frame using, typically, an epoxy adhesive and then connected electrically to bond fingers in the leadframe using fine (typically, 0.001 inch diameter) gold bond wires. The leadframe is then encapsulated in, typically, a silica filled, Novolac epoxy molding compound using a transfer molding process.

As noted briefly above, the die fabrication process creates intrinsic stresses in: the dielectric layers (i.e., a silicon dioxide insulating layers used to, inter alia, electrically isolate the electrical interconnect lines); the aluminum electrical interconnect lines; and, the passivation layer on the surface of the die. When the die is encapsulated, additional stresses are generated by the expansion differential between the die and molding compound as the die cools to room temperature. To further complicate the issue, the adhesive bond between the molding compound sometimes fails (i.e., delaminates) which can concentrate forces and stresses on the die's surface. If the stresses are high enough, it is possible for the passivation layer and/or the dielectric layers to crack. Once this has occurred, moisture can penetrate into the aluminum lines which can cause corrosion leading to device failure. More particularly, referring to FIG. 1, these shear stresses in semiconductor chip 10 cause the passivation layer, not shown, over metal interconnect lines 12 to crack and the entire metal interconnect line 12 to be displaced toward the central, inner region 14 of the chip 10 where the active devices 16 are formed. As shown in FIG. 1, the seal ring 18 is formed around the outer periphery of the chip 10 and contact pads 19 are shown disposed between the inner region 14 and the seal ring 18.

One technique suggested to reduce mechanical stresses at the interface between the surface passivation layer and the plastic molding compound is die coating and wafer coating. Such coatings act as mechanical buffer layers with low elastic moduli and high failure strains which deform to accommodate the mechanical property mismatch between the plastic mold compound and the chip. These coatings are used to promote adhesion between the mold compound and the chip surface, However, these coatings add significant cost to the product.

SUMMARY OF THE INVENTION

In accordance with the present invention a semiconductor structure is provided having: semiconductor chip with semiconductor devices formed in an inner region of the chip; a seal ring formed in the chip and disposed about the inner region; and, a plurality of trenches formed along a surface of the chip, a portion of the seal ring being disposed between the trenches and the inner region of the chip. The trenches are disposed along axes oblique to outer edges of the chip. A cover is disposed over the passivation layer with bottom portions of the cover being disposed in the trenches.

With such an arrangement, the portions of the cover disposed in the trenches form a mechanical interlock arrangement. Therefore, in the event that stresses develop on the outermost metal interconnect 12a (FIG. 1) and overlying passivation layer which may strip the adhesion between the cover and the chip, the cover is prevented from sliding laterally along the chip because of its mechanical interlocking arrangement with the trenches.

In accordance with another feature of the invention, a method is provided for encapsulating a semiconductor chip. The method includes the steps of: providing a semiconductor chip having active semiconductor devices in an inner region of the semiconductor chip and a seal ring in the chip about the inner region; and, forming a plurality of trenches in the chip, a portion of the seal ring being formed between the trenches and the inner region of the chip. A cover is formed having bottom portions in the trenches. The cover is formed by disposing plastic material over the passivation layer and into the trenches to fill such trenches with such plastic material.

BRIEF DESCRIPTION OF THE DRAWING

Other features of the invention, as well as the invention itself, will become more readily apparent from the following detailed description taken together with the accompanying drawings, in which:

FIG. 3 is a cross-sectional view of a portion of the chip of FIG. 2, such cross-section being taken along line 3—3 in FIG. 2; and FIG. 4 is a cross-section view of the chip of FIG. 3 after encapsulation with a cover;

FIG. 5 is a cross-sectional view of a portion of a chip according to an alternative embodiment of the invention; and FIG. 6 is a cross-sectional view of the portion of the chip of FIG. 5 after encapsulation with a cover.

DESCRIPTION OF THE PREFERRED EMBODIMENTS

Figure 1:
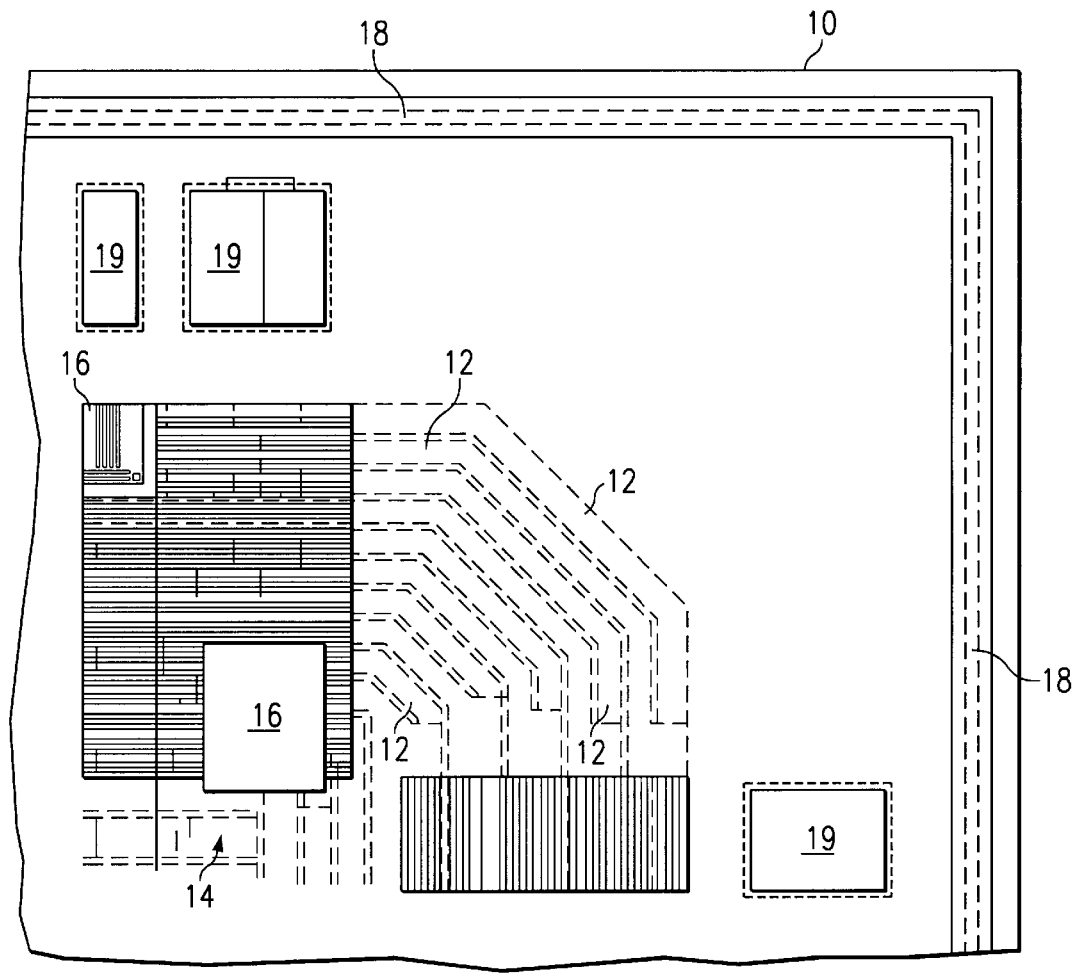
FIG. 1 is a plan view of the upper right hand corner region of a semiconductor chip according to the PRIOR ART.
Figure 2:
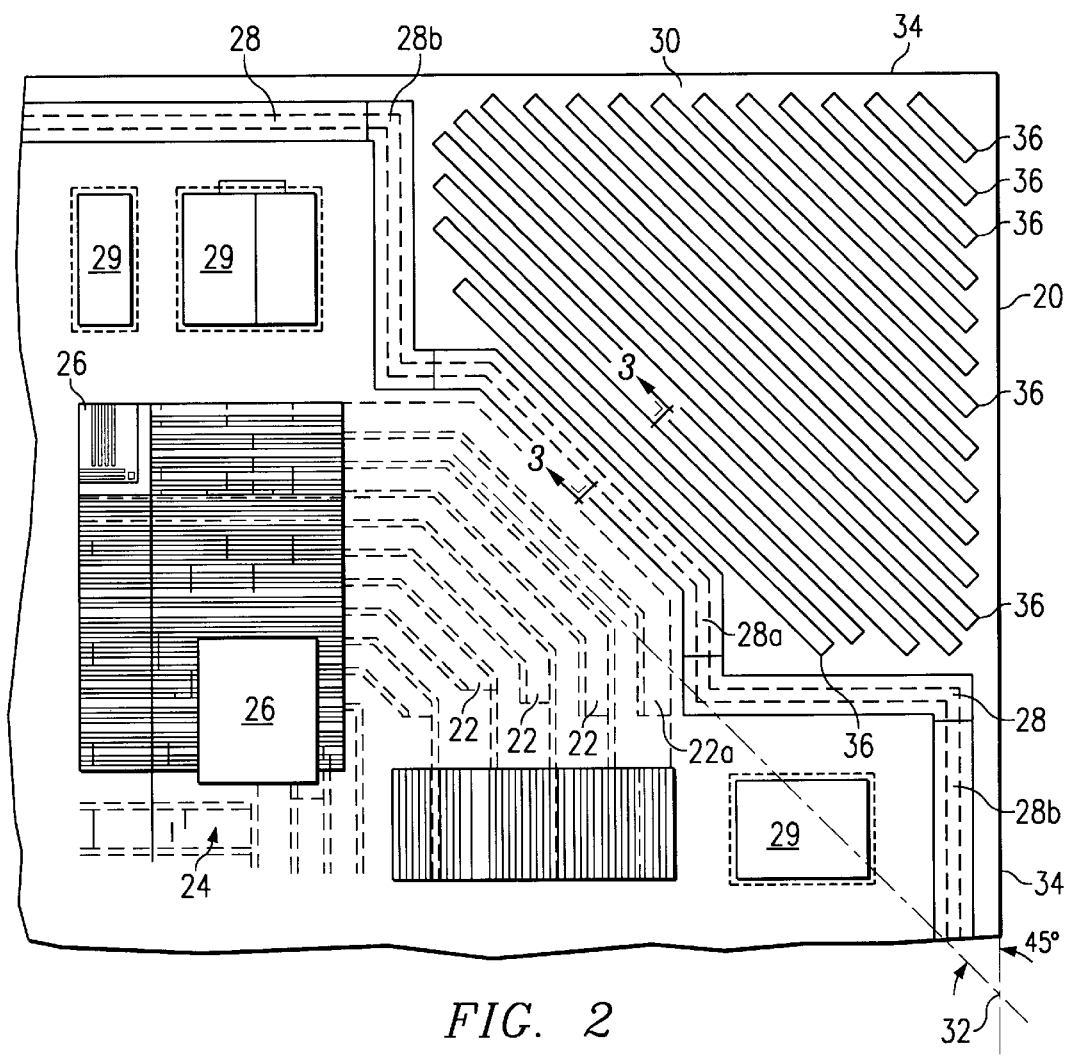
FIG. 2 is a plan view of the upper right hand corner region of a semiconductor chip according to the invention.

Referring now to FIGS. 2 and 3, a semiconductor chip 20 is shown having metal, here aluminum, interconnect lines 22 electrically interconnecting active semiconductor devices 26 formed within an inner region 24 of chip 20 and contact pads 29 disposed about the outer periphery of the inner region 26. A seal ring 28 is formed in a silicon dioxide layer used to electrically isolate the interconnect lines 22, 22a. The seal ring 28 includes horizontally disposed layers of aluminum and vertically disposed post of tungsten. It is noted that, here, the seal ring 28 is disposed inwardly from all four corners of the chip 20, as shown for exemplary upper right hand corner 30 of chip 20. That is, referring also to FIG. 1, the seal ring 18 of FIG. 1 was moved near the corners of the chip to the position shown for seal ring 28 in FIG. 2. More particularly, portions 28a of the seal ring 28 follow the contour of the 45° interconnect lines 22. That is, the lines 22 are disposed along directions 32 which intersect the edge 34 of the chip 20 at an oblique angle, here an angle of 45°, as shown in FIG. 2. It is also noted that portions 28b of the seal ring 28 follow the contour of the bond pads 29, as shown in FIG. 2.

A plurality of elongated trenches 36 is formed along the upper surface of the chip 20. The trenches 36 provide the upper surface of the chip 20 with projections 37 and interleaved therewith, indentions (here trenches 36). Thus, it can be seen that the seal ring 28 was moved to allow construction of the trenches 36 while maintaining passivation seal requirements for the active devices 26 on chip 20. More particularly, the trenches 36 are inserted though into the passivation layer 40 (FIG. 3) and into the dielectric layer 42, which may be multiple layers (i.e., a multi-layer structure 42), at the four chip corners, as shown for exemplary corner 30. The passivation trenches 36 are disposed along axes parallel to the portion 28a of the seal ring 28, i.e., along axes 45° to the edge 34 of the chip 20.

The passivation trenches 36 are elongated depressions formed by standard plasma etching to expose bonding pads. After forming the trenches 36, the chip 20 is affixed to a leadframe, not shown, contact pads 29 are wire bonded to leadframe fingers, and the chip 20 is then electrically tested. Next, a cover 50, FIG. 4, is formed. Here, the cover 50 is a plastic formed by transfer molding. Thus, a source, not shown, of the plastic molding material is heated and the heated material flows over the surface of the chip 20 and into the trenches 36, as shown in FIG. 4. Thus, the cover 50 has disposed along the bottom surface thereof trenches 63 laterally spaced from the trenches 36 in the chip 20 to provide a degree of mechanical interlocking with the trenches 36 formed along the upper surface of the chip 20. That is, the bottom surface of the cover 50 has projections 61 with interleaved indentations (i.e., trenches 63). The projections 37 in the chip 20 are disposed in the indentations 63 in the cover 50 and the projections 61 of the cover 50 are disposed in the indentations, or trenches 36 of the chip 20. The trenches 36 thus provide sites for providing stress relief to the interconnect lines 22 by eliminating delamination by increased adhesion of the plastic mold compound of cover 50 to the chip 20; i.e., by mechanical interlocking thereby reducing the likelihood of passivation layer 40 cracking by reducing the likelihood of mold compound delamination.

Alternatively, if plastic transfer-molding is used to form the cover 50, the plastic mold compound is injected into the mold cavity to fill the entire volume of the cavity, including the passivation trenches 36. Upon curing, a rigid mechanical interlock is created between the mold compound of cover 50 and the chip 20 surface by the interlocking "teeth" or "fingers", or projections created by the trenches 36 and the indentations 61 formed by the cured mold compound of cover 50.

Thus, with either method, in the event of loss of chemical bond adhesion at the interface between the mold compound of cover 50 and chip 20 passivation layer 40, the mechanical interlock by the trenches 36 and the projections 61 (and likewise the trenches 63 and the projections 37) will mechanically constrain the mold compound, preventing its movement relative to the chip 20 surface, and thereby reduce, or eliminate, delamination induced cracking and interconnect line 22 shift.

Here, the trenches 36 are polygons having 10 micron widths with 10 micron spaces between adjacent ones of the trenches 36 (i.e., the trenches 36 have a 20 micrometer center-to-center spacing, or pitch). The depth of the trenches 36 is here 1.8 microns with 3.7 microns of silicon dioxide 42 under the bottom portions 52 of the trenches 36. It should be understood that other depths and silicon dioxide thicknesses may be used. The trenches 36 have sidewalls 53 passing through the passivation layer 40 into the dielectric layer 42. The lengths of the trenches 36 are adjusted to fill the are between the seal ring 28 and the edges 34 of the chip 20, as shown in FIG. 3. The trenches 36 are defined in the same layout layer that contains the polygons used to identify the regions of passivation that is removed from the contact pads 29, thus exposing bare metal of the contact pads 29 for wire bonding to the leadframe. The trenches 36 are implemented into the contact pad 29 passivation etch photomask which is otherwise normally used to define the regions of passivation that are removed after the passivation layer deposition. There, no extra photomask, lithography, deposition, or etch process operations are required to create the trenches.

Referring now to FIG. 5, here the trenches 36' are formed along the upper surface of the chip 20' by providing metal strips 60 within the multi-layer silicon dioxide layer 42 as when the seal ring 28 is formed. The passivation layer 40 is then deposited over the surface of the chip 20' and over the metal strips 60, as shown, to thereby form the trenches 36'. Thus, here again, the trenches 36' provide the upper surface of chip 20' with projections 37' and interleaved therewith, indentations (here trenches 36'). Further, the cover 50', FIG. 6, is formed with the bottom surface thereof having trenches 63' which provide a degree of mechanical interlocking with the projections 37' formed along the upper surface of the chip 20'. That is, the bottom surface of the cover 50' has projections 61' with interleaved indentations (i.e., trenches 63'). The projections 37' in the chip 20' are disposed in the indentations 63' in the cover 50' and the projections 61' of the cover 50' are disposed in the indentations, or trenches 36' of the chip 20'. The trenches 36' thus provide sites for providing stress relief to the interconnect lines by eliminating delamination by increased adhesion of the plastic mold compound of cover 50' to the chip 20'; i.e., by mechanical interlocking thereby reducing the likelihood of passivation layer 40 cracking by reducing the likelihood of mold compound delamination.

Other features of the invention are within the spirit and scope of the appended claims.

What is claimed is:

1. A semiconductor structure, comprising:

a semiconductor chip having: active semiconductor devices formed in an inner region of the chip; a seal ring formed in the chip and disposed about the inner region; and a plurality of trenches formed along a surface of the chip and disposed along axes oblique to outer edges of the chip, a portion of the seal ring being disposed between the trenches and the inner region of the chip.

2. The semiconductor structure recited in claim 1 wherein the trenches are disposed in a corner of the chip.

3. The semiconductor chip recited in claim 2 wherein the semiconductor chip includes:

a semiconductor body;

a dielectric layer disposed over the semiconductor body;

a passivation layer disposed over the dielectric layer; and wherein the trenches have: sidewalls passing through the passivation layer into the dielectric layer; and, bottom portions disposed in the dielectric layer.

4. The semiconductor structure recited in claim 3 wherein the seal ring is disposed in the dielectric layer and the passivation layer is disposed over the seal ring.

5. The semiconductor structure recited in claim 4 wherein the active semiconductor devices are formed in the semiconductor body.

6. The semiconductor structure recited in claim 5 including a cover affixed to the semiconductor chip, such cover having bottom portions disposed in the trenches and on the passivation layer.

7. A semiconductor structure, comprising:

a semiconductor chip having: active semiconductor devices formed in an inner region of the chip; a protrusion and adjacent indentation disposed along an upper surface of the chip and along axes oblique to outer edges of the chip; and a cover having a protrusion and adjacent indentation disposed along a bottom surface of the cover, said protrusion in the cover being disposed in said indentation of the chip and said indentation in the cover being disposed in said protrusion of the chip.

8. The semiconductor structure recited in claim 7 wherein the chip includes a seal ring formed in the chip and disposed about the inner region, a portion of the seal ring being disposed between the indentation and the inner region of the chip.

9. The semiconductor structure recited in claim 7 wherein the indentation and adjacent protrusion are disposed in a corner of the chip.

\* \* \* \* \*